United States Patent [19]
Fries

[11] 3,942,586
[45] Mar. 9, 1976

[54] COOLING ARRANGEMENT FOR FLAT SEMICONDUCTOR COMPONENTS

[75] Inventor: Paul Fries, Erlangen, Germany

[73] Assignee: Siemens Aktiengesellschaft, Munich, Germany

[22] Filed: July 25, 1974

[21] Appl. No.: 491,779

[30] Foreign Application Priority Data
Aug. 14, 1973  Germany............................ 2341097

[52] U.S. Cl. ................ 165/105; 165/122; 317/100; 357/82
[51] Int. Cl.² .. F28D 15/00; H01L 3/00; H01L 5/00
[58] Field of Search ............ 165/105, 122; 317/100; 357/81, 82

[56] References Cited
UNITED STATES PATENTS
2,169,109   8/1939   Muller ........................... 165/122 X

| 3,011,105 | 11/1961 | Le Blanc............................. 357/82 |
| 3,653,433 | 4/1972 | Scharli............................ 165/105 X |
| 3,792,318 | 2/1974 | Fries et al. ....................... 165/105 X |

FOREIGN PATENTS OR APPLICATIONS
791,491   3/1958   United Kingdom................... 357/82

Primary Examiner—Albert W. Davis, Jr.
Attorney, Agent, or Firm—Kenyon & Kenyon Reilly Carr & Chapin

[57] ABSTRACT

An improved cooling arrangement for flat semiconductor components such as disc-type thyristors in which the semiconductor component is clamped between two solid cooling elements with each cooling element carrying at least one heat pipe with attached cooling fins and in which a plurality of such cooling arrangements rotationally displaced are combined in a column-like cooling stack to achieve equally good cooling for all heat pipes.

5 Claims, 2 Drawing Figures

COOLING ARRANGEMENT FOR FLAT SEMICONDUCTOR COMPONENTS

BACKGROUND OF THE INVENTION

This invention relates to the cooling of flat semiconductor components such as disc-type thyristors in general, and more particularly to an improved cooling arrangement which permits cooling a plurality of such semiconductors arranged in a column-like cooling stack.

Arrangements for cooling disc-type thyristors and other flat semiconductors in which the semiconductor is clamped in good thermal contact between two cooling elements of thermally highly conductive material each having at least one heat pipe, with fins on its end attached transversely to the heat pipe axis, disposed in an elongated recess therein have been developed. Heat pipes have been found particularly useful in such an application. As is well known in the art, heat pipes comprise a pipe of thermally conductive material closed on both ends and lined on the inside with a wick. The heat pipe is partially filled with an evapoarable working fluid. An arrangement such as this is disclosed in Belgian Pat. No. 794,501.

The heat pipe can be inserted into the recess in the cooling element with an end of the heat pipe therein and the other end with fins protruding. An arrangement is also possible where the heat pipe extends through the recess, centered therein, with cooling fins pushed or placed on the heat pipe on both sides of the cooling element. The heat pipe is preferably soldered, shrunk or screwed into the recess for better thermal contact. As an example, the recess may be a hole which is formed parallel to the contact surface of the semiconductor component and the cooling element. Preferably, straight heat pipes are used.

In this prior art cooling arrangement, heat developed by the semiconductor component and given off by the cooling element is conducted to the cooling fins through the working fluid and to a small extent, also through the wall of the heat pipe and is removed from the cooling fins through the use of a cooling medium directed thereover by convection or by means of a blower. As compared to other known arrangements for cooling semiconductor components, this cooling arrangement requires less material for the two cooling elements which typically consist of copper or aluminum. As a result, it can be produced more readily and inexpensively for a given cooling capacity.

In practice, e.g., in heavy duty drives or for high voltage dc transmission, flat semiconductor components such as disc thyristors are frequently connected in series or parallel to form a single valve or controlled rectifier. It is common in such an electrical arrangement to also arrange the individual semiconductor components physically close together and in particular, to stack them one over the other. For example, German Offenlegungsschrift No. 1,564,694 teaches combining a plurality of this type of semiconductor rectifiers in a column-like cooling stack with alternating cooling elements between the disc thyristors. In this arrangement, a cooling liquid flows through the individual cooling elements. A typical clamping device clamping together at least two such cooling stack arrangements is disclosed in German Auslegeschrift No. 1,614,640.

Clearly, this arrangement is more complex and costly than the heat pipe arrangement disclosed herein above. Thus, it is clear that there is a need for an improved cooling arrangement for stacked flat semiconductors which can: (1) take advantage of the benefits of the heat pipe; and (2) in addition, provide adequate cooling to the semiconductors no matter what their location is within the column or stack. That is, the problem is to provide an arrangement in which cooling air of essentially the same temperature can flow over all the heat pipes in such an arrangement.

SUMMARY OF THE INVENTION

In attempting to meet the two requirements noted above, starting with the prior art heat pipe cooling arrangement and using the prior art stack arrangement as a model, one would most likely arrive at a series-stack design in which the heat pipes protruding from the individual cooling elements are arranged parallel to each other. In the direction of the axis of the stack, the individual heat pipes would be situated exactly one behind the other. When cooling by convection or by means of a blower, which is preferably done in the direction of the axis of the stack using, for example, air as the cooling medium, the last heat pipes in the flow direction would receive coolant which has been preheated by the dissipation heat of all preceding cooling arrangements of the cooling stack. As a result, the load capacity of the last semiconductor component would have to be considerably reduced particularly where disc-type thyristors with high dissipation are used as semiconductor components in the cooling stack. The second portion of the above noted need, i.e., the efficient and equal cooling of the total arrangement is thus, not achieved.

The present invention solves this problem of uniformity cooling by combining the basic cooling arrangement of the aforementioned Belgian patent with a number of other cooling arrangements in a column-like cooling stack. In this cooling stack, the individual semiconductor components are axially aligned, with the axes of the heat pipes of the cooling elements which are located one over the other, arranged so that they are rotationally displaced with respect to each other about the stack axis. Preferably, this displacement is uniform, that is, the heat pipes of the one cooling arrangement are arranged relative to the heat pipes of the other cooling arrangements displaced by the same angular amount, progressing uniformly or not uniformly in the direction of the stack axis.

For natural convection of the coolant, but particularly if a blower is employed for forced cooling of the heat pipes, it is furthermore advantageous to arrange the cooling stack within a hollow structure with a cylindrical inside surface. The cylindrical surface acts as a guide surface for the coolant that flows past the heat pipes and insures that the in flowing coolant is forced to flow over the cooling fins of the heat pipes and thus cannot flow off laterally.

In accordance with a further feature of the invention, provision is made for at least one blower at the input or output of the hollow structure. In particular, a radial blower is advantageously provided. It is furthermore helpful to arrange baffles in the empty space between the heat pipes. If the individual heat pipes together with the flow baffles are arranged helically in the cooling stack arrangement, care must be taken in the interest of increased heat transfer that the direction of rotation of a blower aligned axially with the axis of the stack is chosen opposite to the sense of rotation of the helix arrangement, as seen in the flow direction.

DETAILED DESCRIPTION OF THE PREFERRED EMBODIMENT

Figure 1:
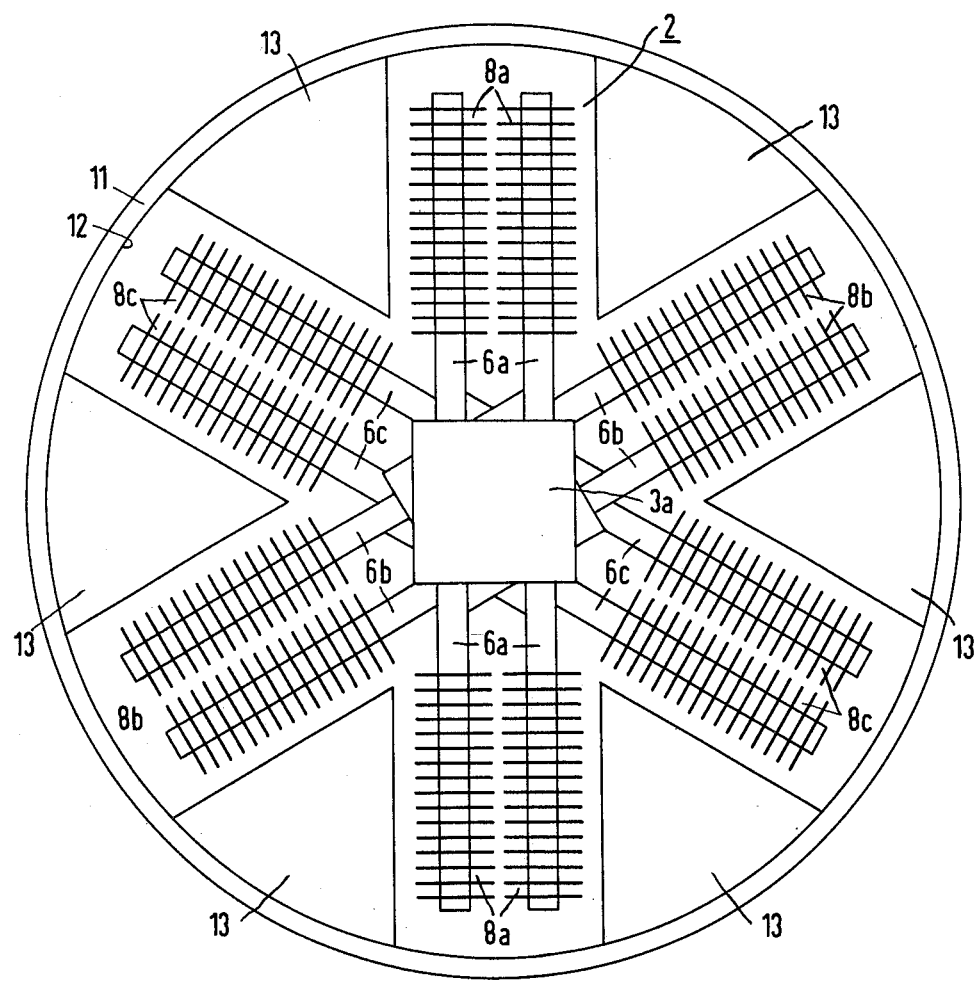
FIG. 1 is a plan view of a cooling stack according to the present invention.
Figure 2:
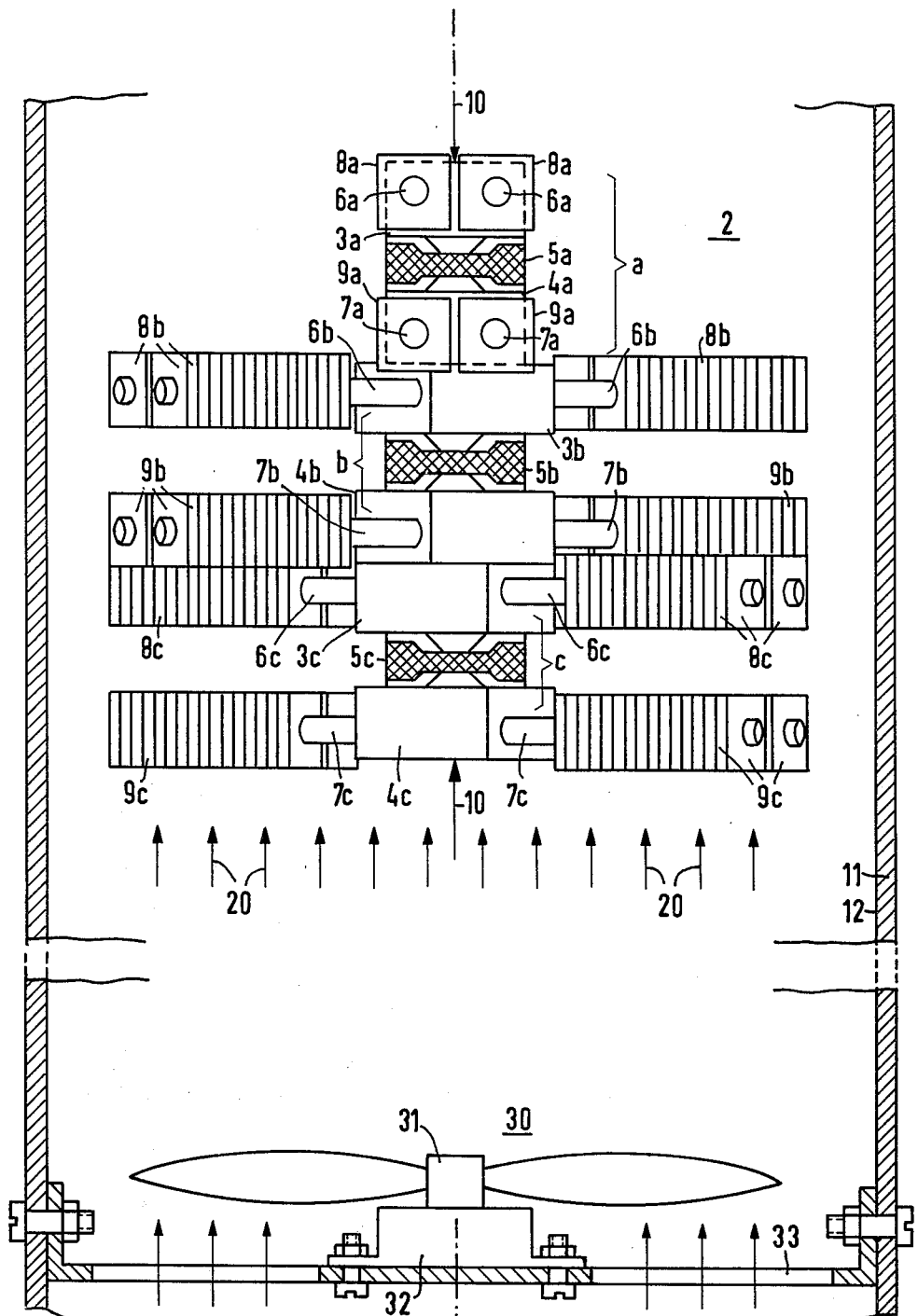
FIG. 2 is an elevation view, partially in cross section of the arrangement of FIG. 1.

The arrangement of the present invention can best be understood by viewing FIGS. 1 and 2. The overall cooling stack arrangement designated 2 is a helical stack arrangement comprising a total of $n = 3$ individual cooling arrangements $a$, $b$ and $c$ stacked helically. That is, as will become more apparent below, the heat pipes of these cooling arrangements forms a helix. Although in the present example the number of individual arrangements $n$ is only 3, it will be recognized that this number can be much larger than 3. Each of the three cooling arrangements $a$, $b$ and $c$ has two solid rectangular cooling elements 3 and 4 of a thermally highly conductive material, e.g., copper, a flat semiconductor component 5, such as a disc-type thyristor which is arranged between the two cooling elements and four elongated heat pipes extending in pairs through the cooling elements. The heat pipes are designated as 6 and 7. In each of the individual cooling, the elements are given letter designations corresponding to the individual cooling arrangement above to which they belong. Thus, the semiconductor component 5 in the arrangement $a$ is designated 5$a$, its rectangular cooling elements as 3 $a$ and 4$a$ and its heat pipes as 6$a$ and 7$a$. The heat pipes themselves, as is well known in the art, comprise tubes closed on both sides and lined on the inside wall with a wick of capillary structure, the tubes partially filled with an evaporable working fluid. For more details as to heat pipe construction, see U.S. Pat. No. 2,350,348. Copper can be used as the tube material as can other conductors. As is clearly illustrated on FIG. 2, the cooling elements 3$a$ through 3$c$ and 4$a$ through 4$c$ contain conical steps which are maintained in good thermal contact with the thyristors or other flat semiconductors 5$a$ through 5$c$ clamped therebetween. As illustrated, the semiconductor 5$a$ is clamped between the cooling elements 3$a$ and 4$a$, the semiconductor 5$b$ between the cooling elements 3$b$ and 4$b$ and the semiconductor 5$c$ between cooling elements 3$c$ and 4$c$. In well known fashion, the semiconductors 5$a$, 5$b$ and 5$c$ can comprise, for example, a portion of a rectifier.

Two heat pipes are inserted through each of the cooling elements 3$a$ through 3$c$ and 4$a$ through 4$c$. The heat pipes associated with the elements 3$a$ through 3$c$ are designated 6$a$ through 6$c$ and those associated with the elements 4$a$ through 4$c$ as 7$a$ through 7$c$. The two heat pipes inserted into the top cooling element 3$a$ of the upper cooling arrangement $a$ are inserted to be in good thermal contact with the cooling element and are arranged parallel to each other and parallel to the contact surface. The corresponding heat pipes 7$a$ are inserted parallel thereto in the lower cooling element 4$a$ of the upper cooling arrangement. From the plan view of FIG. 1, only the top heat pipes 6$a$ are visible since they are directly above the lower heat pipes 7$a$. Cooling fins 8$a$ are attached to the protruding portions of the two heat pipes 6$a$ transversely to their axis and in good thermal contact. Similarly, cooling fins 9$a$ are also arranged on the heat pipes 7 $b$. In similar fashion, fins 8$b$ and 8$c$ and 9$b$ and 9$c$ are arranged on the heat pipes 6$b$ and 6$c$ and 7$b$ and 7$c$ respectively. The radial extension of the heat pipes associated with each arrangement $a$, $b$ and $c$ is rotated relative to the preceding arrangement by an angle of $(180°/n)$ i.e., by an angle of 60° in the illustrated embodiment. A stack arrangement for n larger than 3 can also be made. In any case, the individual cooling arrangements are rotated by the same angular amount so that adjacent cooling arrangements are rotated relative to each other by an integral multiple of the angle $(180°/n)$.

In other words, were $n = 4$ the second cooling arrangement could be rotated 45°, third cooling arrangement 135° and the fourth cooling arrangement by 90° with respect to the first cooling arrangement. This results in non-uniform rotation but one in which the required conditions of relative rotation are met.

The helical stack arrangement 2 is held pressed together using a well known type of clamping device, not shown, with force applied in the direction of arrows 10, i.e., in the direction of the axis of the stack.

Cooling air is supplied as a coolant, being blown by a fan or blower 30 onto the helical stack 2. As viewed on FIG. 1, the flow is out of the paper. The flow on FIG. 2 is in the direction of arrows 20. The blower 30 comprises a blower impeller 31 and an electric motor 32. In order that the cooling air cannot flow off outward, radially to the axis of the stack, a hollow structure 11 with a cylindrical inside surface 12 is provided consisting, for example, of an electrically insulating material. As illustrated, it surrounds the helical stack 2 closely and concentrically. Along with other insulating materials, transparent plastic is particularly suitable for the structure 11. The blower 30 is mounted to the hollow structure 11 using a support strap 33 which may be made of metal. Because of the hollow structure 11, cooling air, entering through lower aperture provided for that purpose, is forced to flow upward in an essentially axial direction. The stream of cooling air then encounters sequentially the cross section of the six heat pipes 7$c$, 7$b$ and 7$a$. Each of these heat pipes is supplied with a cooling air which is essentially of the same temperature. The heat pipes 6$c$, 6$a$ and 6$b$ arranged behind the corresponding heat pipe 7$c$, 7$b$ and 7$a$ in the direction of flow receive air which has already been partially preheated. This can be avoided by a rotation of the heat pipe 6$a$, 6$b$ and 6$c$ of the upper cooling elements 3$a$, 3$b$ and 3$c$ respectively with respect to the corresponding heat pipe 7$a$, 7$b$ and 7$c$ of the corresponding lower cooling elements 4$a$, 4$b$ and 4$c$. For example, a rotation of 90° would be effective for this purpose.

It is also possible to combine the helical stack 2 of FIGS. 1 and 2 into a single structural unit along with a radial blower. In such a case, the radial blower must be placed either at the lower entrance or upper exit of the hollow structure 11 which acts as a cooling duct. Preferably, the diameter of the radial blower should be approximately equal to the inside diameter of the hollow structure 11. In that case, the vane area of the blower coincides with the cooling fin area of the helical stack and its hub area with the central cooling elements 3 and 4.

To prevent cooling air from flowing unused between mutually displaced successive cooling arrangements $a$, $b$ and $c$, the six spaces between the heat pipes can be covered as illustrated by FIG. 1 using thin, sector-shaped flow baffles 13 extending in the flow direction.

The baffles 13 which preferably are arranged inclined in the hollow structure 11 may comprise, for example, insulating material and can be attached to the guide surface 12 of the hollow structure 11. With such an arrangement, the hollow structure 11 then provides a support for the flow baffles 11, and possibly for the blower, in addition to acting as a guide channel for the cooling air. Incidentally, the flow baffles 11 can be arranged helically within the structure 11. Other components such as transformers, resistors and transistors which disipate heat can be arranged in the empty space of the stack. The exhaust air from the helical stack arrangement can be conducted to a heat exchanger if the semiconductor components are arranged within a cabinet. It should further be emphasized that rotational stacking of cooling arrangements is possible even where the cooling element has only a single heat pipe. In that case also, the cooling arrangement can be of helical design. The heat pipes again can be aligned perferably perpendicular to the axis of the stack. In particular where a large number of cooling elements are provided in the stack and where two adjacent cooling elements are combined into a solid cooling element unit, a space saving cooling stack arrangement is obtained in which all the heat pipes receive equally good cooling while still employing an arrangement which is technically simple and inexpensive.

In conclusion, it should be noted that, in arranging rotational displacement, care should be taken, if at all possible, that none of the individual heat pipes are coincident with any of the preceding heat pipes as seen in the flow direction of the coolant. If the cost of the blower must be maintained at a reasonably low level, it may then be justifiable to arrange two heat pipes one behind the other. In the general case, the flow baffles cannot be eliminated unless a substantial reduction of the blower effect can be tolerated. The flow baffles must thus always be arranged so that the flow onto heat pipes which follow the direction of the flow is not impeded.

Thus, an improved cooling arrangement for stacked flat semiconductors components and their associated cooling elements has been shown. Although a specific embodiment has been illustrated and described, it will be obvious to those skilled in the art that various modifications may be made without departing from the spirit of the invention which is intended to be limited solely by the appended claims.

What is claimed is:

1. A cooling arrangement for a plurality of flat semiconductor components such as disc-type thyristors, made up of a plurality of cooling arrangements each comprising two cooling elements of thermally highly conductive material with a semiconductor clamped therebetween in good thermal contact, with each cooling element provided with at least one elongated recess into which is inserted in good thermal contact a portion of a heat pipe closed on both sides, lined on the inside with a wick and partially filled with an evaporable working fluid with cooling fins attached with good thermal contact on the protruding portion of the heat pipes transversely to their axes, comprising a plurality of individual cooling arrangements arranged in a column-like cooling stack with the individual semiconductor components axially aligned with each other and the axes of the heat pipes of the cooling element placed one on top of the other and arranged such that they are angularly displaced with respect to each other about the axis of the stack in helical fashion with the helix so formed having a first direction of rotation, and a blower forcing air through said column, said blower having a direction or rotation, as viewed in the flow direction of the coolant, which is opposite to the direction of rotation of said helical arrangement of heat pipes.

2. A cooling arrangement according to claim 1 and further including a hollow structure with a cylindrical inside surface enclosing said cooling stack.

3. A cooling arrangement according to claim 2 and further including flow baffles arranged in the empty spaces between heat pipes.

4. A cooling arrangement according to claim 3 wherein said flow baffles are shaped as circular sectors and are arranged in an inclined manner inside the hollow cylindrical structure.

5. A cooling arrangement according to claim 1 wherein said blower is a radial blower.

* * * * *